United States Patent
Ploessl et al.

(10) Patent No.: US 8,158,995 B2
(45) Date of Patent: Apr. 17, 2012

(54) OPTOELECTRONIC SEMICONDUCTOR CHIP

(75) Inventors: Andreas Ploessl, Regensburg (DE); Ralph Wirth, Mintraching OT Auhof (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 809 days.

(21) Appl. No.: 11/992,815

(22) PCT Filed: Sep. 14, 2006

(86) PCT No.: PCT/DE2006/001616
§ 371 (c)(1),
(2), (4) Date: Jul. 14, 2008

(87) PCT Pub. No.: WO2007/036198
PCT Pub. Date: Apr. 5, 2007

(65) Prior Publication Data
US 2010/0264434 A1    Oct. 21, 2010

(30) Foreign Application Priority Data

Sep. 29, 2005 (DE) .......... 10 2005 046 691
May 19, 2006 (DE) .......... 10 2006 023 685

(51) Int. Cl.
*H01L 33/46* (2010.01)
(52) U.S. Cl. .................. 257/98; 257/E33.069
(58) Field of Classification Search .......... 257/78, 257/79, 98, 99, 100, E33.069
See application file for complete search history.

(56) References Cited

U.S. PATENT DOCUMENTS

| 5,376,580 A | 12/1994 | Kish et al. |
| 5,684,309 A | 11/1997 | McIntosh et al. |
| 5,831,277 A | 11/1998 | Razeghi |
| 5,837,561 A | 11/1998 | Kish |
| 6,111,272 A | 8/2000 | Heinen |
| 6,172,382 B1 | 1/2001 | Nagahama et al. |
| 6,849,881 B1 | 2/2005 | Harle et al. |
| 7,510,782 B2 * | 3/2009 | Kato et al. ............ 428/690 |
| 7,824,955 B2 * | 11/2010 | White et al. .......... 438/104 |
| 2003/0116770 A1 | 6/2003 | Chang |
| 2003/0127654 A1 * | 7/2003 | Eisert et al. .......... 257/78 |
| 2004/0056254 A1 * | 3/2004 | Bader et al. .......... 257/79 |

(Continued)

FOREIGN PATENT DOCUMENTS

DE    197191621 A1    11/1998

(Continued)

OTHER PUBLICATIONS

L. Spanhel et al., "Semiconductor Clusters in Sol-Gel Process: Quantized Aggregation, Gelation and Crystal Growth in Concentrated ZnO Colloids", American Chemical Society, 1991, vol. 113, pp. 2826-2833.

(Continued)

*Primary Examiner* — Evan Pert
*Assistant Examiner* — Selim Ahmed
(74) *Attorney, Agent, or Firm* — Cozen O'Connor

(57) ABSTRACT

An optoelectronic semiconductor chip is disclosed which emits electromagnetic radiation from its front side (7) during operation, comprising a semiconductor layer sequence (1) having an active region (4) suitable for generating the electromagnetic radiation, and a separately produced TCO supporting substrate (10), which is arranged at the semiconductor layer sequence and has a material from the group of transparent conductive oxides (TCO) and mechanically supports the semiconductor layer sequence (1).

13 Claims, 2 Drawing Sheets

U.S. PATENT DOCUMENTS

| | | |
|---|---|---|
| 2004/0104390 A1 | 6/2004 | Sano et al. |
| 2004/0104393 A1* | 6/2004 | Liu et al. ............ 257/79 |
| 2004/0115845 A1 | 6/2004 | Pan et al. |
| 2004/0135166 A1* | 7/2004 | Yamada et al. ........ 257/103 |
| 2004/0188791 A1 | 9/2004 | Horng et al. |
| 2005/0196887 A1 | 9/2005 | Liu |
| 2005/0205875 A1* | 9/2005 | Shei et al. ............ 257/79 |
| 2006/0131597 A1* | 6/2006 | Lee et al. ............ 257/98 |

FOREIGN PATENT DOCUMENTS

| | | |
|---|---|---|
| DE | 10329884 A1 | 3/2004 |
| DE | 103 22 705 | 7/2004 |
| EP | 0905797 | 3/1999 |
| TW | 280039 | 7/1996 |
| TW | 565957 | 12/2003 |
| TW | 232604 | 5/2005 |
| TW | 271256 | 7/2005 |
| WO | WO 01/39282 A2 | 5/2001 |
| WO | WO 01/61765 A | 8/2001 |
| WO | WO 01/82384 A | 11/2001 |
| WO | WO 2007/134581 | 11/2007 |

OTHER PUBLICATIONS

T. Minami, "New n-Type Transparent Conducting Oxides", www.mrs.org/publications/bulletin , Aug. 2000, pp. 38-44.

* cited by examiner

OPTOELECTRONIC SEMICONDUCTOR CHIP

RELATED APPLICATIONS

This is a U.S. national stage of application No. PCT/DE2006/001616, filed on 14 Sep. 2006.

This patent application claims the priorities of German patent applications 102006023685.8 filed 19 May 2006 and 102005046691.5 filed 29 Sep. 2005, the disclosure content of both of which is hereby incorporated by reference.

FIELD OF THE INVENTION

The invention relates to an optoelectronic semiconductor chip with improved radiation efficiency.

BACKGROUND OF THE INVENTION

The document EP 0 905 797 A2 discloses radiation-emitting semiconductor chips comprising semiconductor layer sequences that are grown epitaxially on a growth substrate. Since the growth substrate generally absorbs part of the electromagnetic radiation generated within the semiconductor layer sequence, the document EP 0 905 797 A2 proposes fixing the epitaxial semiconductor layer sequence to a separate carrier body with the aid of a separate connecting means and removing the growth substrate. In this case, for example metal but also semi-insulating silicon, which absorbs the radiation of the semiconductor chip, is proposed as material for the separate carrier body. Furthermore, for example an adhesive or a solder is proposed as connecting means.

If the separate carrier body is produced from a material that absorbs the radiations of the semiconductor chip, such as metal or silicon for example, then the efficiency of the semiconductor chip can be reduced on account of the absorption of the radiation.

SUMMARY OF THE INVENTION

It is an object of the present invention to specify an optoelectronic semiconductor chip which has a good radiation efficiency and which can be produced in a simple manner.

This and other objects are attained in accordance with one aspect of the present invention directed to an optoelectronic semiconductor chip which emits electromagnetic radiation from its front side comprises in particular:
- a semiconductor layer sequence having an active region suitable for generating the electromagnetic radiation, and
- a separately produced TCO supporting substrate, which is arranged at the semiconductor layer sequence and has a material from the group of transparent conductive oxides (TCO) and mechanically supports the semiconductor layer sequence.

Transparent conductive oxides ("TCO" for short) are transparent conductive materials, generally metal oxides, such as, for example, zinc oxide, tin oxide, cadmium oxide, titanium oxide, indium oxide or indium tin oxide (ITO). In addition to binary metal-oxygen compounds such as, for example, ZnO, $SnO_2$ or $In_2O_3$, the group of TCOs also includes ternary metal-oxygen compounds such as, for example, $Zn_2SnO_4$, $CdSnO_3$, $ZnSnO_3$, $MgIn_2O_4$, $GaInO_3$, $Zn_2In_2O_5$ or $In_4Sn_3O_{12}$ or mixtures of different transparent conductive oxides. Furthermore, the TCOs do not necessarily correspond to a stoichiometric composition and can also be p- or n-doped.

An optoelectronic semiconductor chip comprising a TCO supporting substrate affords the advantage that, firstly, it can be electrically connected via the TCO supporting substrate on account of the electrical conductivity of the TCO.

Furthermore, the TCO supporting substrate advantageously absorbs none or a comparatively small part of the radiation generated in the semiconductor layer sequence during operation, since the TCOs are transmissive to the radiation of the semiconductor chip. This can contribute to an increased radiation efficiency of the semiconductor chip in comparison with a semiconductor chip comprising an absorbent substrate such as, for example, an epitaxial growth substrate or alternatively a separate radiation-opaque carrier.

The active radiation-generating region of the semiconductor chip preferably comprises a pn junction, a double heterostructure, a single quantum well or particularly preferably a multiple quantum well structure for generating radiation. In this case, the designation "quantum well structure" does not comprise any indication about the dimensionality of the quantum well structure. It therefore encompasses, inter alia, quantum wells, quantum wires and quantum dots and any combination of these structures. Examples of MQW structures are described in the documents WO 01/39282, U.S. Pat. No. 5,831,277, U.S. Pat. No. 6,172,382 B1 and U.S. Pat. No. 5,684,309, the disclosure content of all of which is hereby incorporated by reference.

The semiconductor layer sequence is based for example on a III/V compound semiconductor material such as a nitride compound semiconductor material, a phosphide compound semiconductor material or an arsenide compound semiconductor material.

In the present case, "based on nitride compound semiconductor material", means that at least one part of the semiconductor layer sequence comprises a nitride/III compound semiconductor material, preferably $Al_nGa_mIn_{1-n-m}N$, where $0 \leq n \leq 1$, $0 \leq m \leq 1$ and $n+m \leq 1$. In this case, this material need not necessarily have a mathematically exact composition according to the above formula. Rather, it can have one or more dopants and additional constituents which essentially do not change the characteristic physical properties of the $Al_nGa_mIn_{1-n-m}N$ material. For the sake of simplicity, however, the above formula only comprises the essential constituents of the crystal lattice (Al, Ga, In, N), even if these can be replaced in part by small quantities of further substances.

In an equivalent manner, in the present case, "based on phosphide compound semiconductor material", means that at least one part of the semiconductor layer sequence comprises a phosphide/III compound semiconductor material, preferably $Al_nGa_mIn_{1-n-m}P$, where $0 \leq n \leq 1$, $0 \leq m \leq 1$ and $n+m \leq 1$. In this case, this material need not necessarily have a mathematically exact composition according to the above formula. Rather, it can have one or more dopants and additional constituents which essentially do not change the characteristic physical properties of the $Al_nGa_mIn_{1-n-m}P$ material. For the sake of simplicity, however, the above formula only comprises the essential constituents of the crystal lattice (Al, Ga, In, P), even if these can be replaced in part by small quantities of further substances.

Likewise in a manner equivalent to "based on nitride compound semiconductor material" and "based on phosphide compound semiconductor material", in the present case, "based on arsenide compound semiconductor material", means that at least one part of the semiconductor layer sequence comprises an arsenide/III compound semiconductor material, preferably $Al_nGa_mIn_{1-n-m}As$, where $0 \leq n \leq 1$, $0 \leq m \leq 1$ and $n+m \leq 1$.

This material, too, need not necessarily have a mathematically exact composition according to the above formula. Rather, it can have one or more dopants and additional constituents which essentially do not change the characteristic physical properties of the $Al_nGa_mIn_{1-n-m}As$ material. For the sake of simplicity, however, the above formula only comprises the essential constituents of the crystal lattice (Al, Ga, In, As), even if these can be replaced in part by small quantities of further substances.

In one preferred embodiment, the TCO supporting substrate has a refractive index which is less than the refractive index of the semiconductor layer sequence. In general, the TCOs even have a significantly smaller refractive index than the semiconductor layer sequence. Particularly preferably, the refractive index of the TCO substrate has a value of less than or equal to 2 and the refractive index of the semiconductor layer sequence has a value of greater than or equal to 3. However, the semiconductor layer sequence can also have a refractive index lying between 2.2 and 3, including the limits, for example if the semiconductor layer sequence is based on a nitride compound semiconductor material.

If the TCO supporting substrate has a refractive index which is significantly less than that of the semiconductor layer sequence, then this entails the advantage that a significant part of the electromagnetic radiation of the active region which impinges on the TCO supporting substrate/semiconductor layer sequence interface is already reflected back there into the semiconductor layer sequence and does not penetrate into the TCO supporting substrate.

In a further embodiment, the TCO supporting substrate is fitted to the semiconductor layer sequence by means of direct bonding, diffusion bonding or adhesive bonding.

Direct bonding and diffusion bonding, in contrast to adhesive bonding, are connecting methods which manage without a joining layer. With the aid of direct bonding, joining partners are connected to one another by bringing them into contact with one another, such that the joining partners adhere to one another on account of weak interactions such as Van-der-Waals forces or by formation of hydrogen bonds. By exposing the joining partners to temperature, their adhesion to one another can advantageously be increased.

Diffusion bonding and direct bonding differ in particular by virtue of the requirements made of the roughness of the surfaces to be connected.

For direct bonding, the joining partners must have sufficiently planar and smooth surfaces preferably with an rms value of less than or equal to 1 nm, such that the interaction energy between the surfaces to be connected suffices upon contact to elastically distort the joining partners and obtain a mechanical contact between them that is formed over the whole area. Depending on the reactivity of the surface, this atomic contact does or does not suffice to form strong chemical bonds (covalent, ionic, metallic). If the resulting chemical bonds between the joining partners are formed excessively weakly, then exposure to temperature can improve the bonding.

In the case of diffusion bonding, the requirements made of the surface roughness are less stringent—here it is generally possible to connect surfaces with an rms value of up to max. 0.4 μm—but exposure to pressure and temperature is necessary here in order to obtain a sufficient bonding between the joining partners. In this case, the exposure to temperature is preferably effected with homologous temperatures (temperature in K relative to the melting point of the respective material) of between 0.5 and 0.8, including the limits. The exposure to pressure is preferably effected with a pressure in the region of the yield stress of the material of the joining partners to be connected.

In particular connecting methods without a joining layer such as, for example, direct bonding or diffusion bonding afford the advantage that the joining agent of the joining layer, such as an adhesive for example, cannot outgas and contaminate the semiconductor chip. This generally makes it possible, during the production of the semiconductor chip, after the connecting step, to employ processes at higher temperatures than in the case where the connection between TCO supporting substrate and semiconductor layer sequence was produced with the aid of a joining layer. Furthermore, the temperature resistance and chemical resistance of the semiconductor chip is not restricted by the joining agent. As a result, under certain circumstances broader fields of application are opened up for the semiconductor chip and a broader selection of further process steps after the production of the semiconductor chip is made possible, for example from construction and connection technology, such as soldering mounting onto a circuit board with low thermal resistance.

In comparison with the connecting methods without a joining layer, connecting methods with a joining layer, such as adhesive bonding for example, afford the advantage that they can generally be carried out more simply and more expediently. Furthermore, unevennesses of the surfaces to be connected can advantageously be compensated for by means of a joining layer. Since, in the connecting methods without a joining layer, the semiconductor layer sequence generally has to be exposed to pressure and/or temperature, there is a greater risk of damage to the semiconductor layer sequence, and in particular the active region thereof in the process.

If the TCO supporting substrate is fitted to the semiconductor layer sequence by means of adhesive bonding, then for example an electrically conductive adhesive can be used in order to be able to electrically conductively connect the semiconductor chip via the TCO supporting substrate in a simple manner, for example to conductor tracks of a circuit board or electrical contact regions of a housing.

As an alternative, an electrically insulating adhesive can also be used, such as bis-benzocyclobutene (BCB) for example. BCB affords the advantage of being compatible with many semiconductor processes, of being readily transmissive to the radiation emitted by the semiconductor body, and furthermore, with exclusion of oxygen, of not yellowing or yellowing only slightly.

In order to produce an electrically conductive connection between the joining partners by means of electrically insulating adhesive, such as BCB for example, the adhesive layer is chosen to be so thin that the surfaces to be connected are at least partially in direct contact with one another via elevations on account of their roughness and an electrical contact is thus formed between them. In order to improve the electrical contact between TCO supporting substrate and semiconductor layer sequence in this embodiment, local metallic contact locations can furthermore be arranged on the surfaces that are respectively to be connected, preferably in such a way that these are located one on top of another during the joining step. Surfaces having a minimum roughness of a few nm can normally be connected to one another by this method.

In a further preferred embodiment, a TCO layer having a material from the group of TCOs is arranged between the semiconductor layer sequence and the TCO supporting substrate. Said TCO layer can firstly be used to reduce roughnesses of the surface to be connected, particularly in the connecting methods without a joining layer. For this purpose, the TCO layer is applied for example to the semiconductor layer sequence and the surface of the TCO layer that is to be connected is subjected to chemical mechanical polishing. In this case, the loss of material during polishing must be taken into account when dimensioning the thickness of the TCO layer. The thickness of the TCO layer preferably lies between 50 nm and 10 µm, including the limits. Particularly preferably, the thickness of the TCO layer lies between 50 nm and 2 µm, once again including the limits.

Furthermore, the TCO layer can also serve as a contact layer that improves the electrical contact between the semiconductor layer sequence and the TCO supporting substrate, preferably to the effect that the latter has an essentially ohmic characteristic. The TCO layer can be applied for example by means of an epitaxy process, by sputtering, vapor deposition or a sol-gel process.

Furthermore, a TCO contact layer can also be arranged, in addition to the TCO layer, between the semiconductor layer sequence and the TCO supporting substrate. The TCO contact layer likewise has a material from the group of TCOs and serves to improve the electrical contact between semiconductor layer sequence and TCO supporting substrate, preferably in such a way that the latter has an essentially ohmic characteristic. The TCO contact layer can likewise be applied by means of an epitaxy process, by sputtering, vapor deposition or a sol-gel process.

The thickness of the TCO contact layer likewise preferably lies between 50 nm and 10 µm, including the limits. Particularly preferably, the thickness of the TCO contact layer lies between 50 nm and 2 µm, once again including the limits.

The TCO contact layer and the TCO layer can also be provided with a dopant; this preferably involves an n-type dopant such as Al, B, Ga, In, Si, Ge, Ti, Zr or Hf. n-type dopants are described for example in the document entitled "New n-type transparent conducting oxides", T. Minami, MRS Bulletin, August 2000, the disclosure content of which in this respect is hereby incorporated by reference.

Furthermore, the TCO contact layer can also comprise a plurality of layers. It is thus possible, by way of example, for the TCO contact layer to comprise an n-doped layer, which preferably directly adjoins the TCO supporting substrate, and a likewise n-doped transverse conductive layer, which preferably directly adjoins the semiconductor layer sequence, wherein the n-doped layer has a higher doping than the transverse conductive layer.

Preferably, the TCO contact layer has a thickness lying between 50 nm and 10 µm, preferably between 50 nm and 2 µm and particularly preferably between 1 µm and 5 µm, in each case including the limits.

By means of the TCO layer or the TCO contact layer or both layers, the electrical contact between TCO supporting substrate and a semiconductor layer sequence can generally be improved since these layers can be applied to the semiconductor layer sequence by means of a suitable deposition method, such as sputtering for example, in the course of which a good conductive contact is obtained between the deposited layer and the semiconductor material. Achieving a good electrical contact between TCO supporting substrate and TCO layer or TCO contact layer during the joining step is generally significantly simpler than during the joining of semiconductor layer sequence and TCO supporting substrate.

In a further particularly preferred embodiment, a reflective layer that reflects the radiation of the semiconductor chip is arranged between the active region of the semiconductor layer sequence and the rear side of the semiconductor chip, opposite the front side of said chip, and particularly preferably between semiconductor layer sequence and TCO supporting substrate. Such a reflective layer can be used to improve the reflection of electromagnetic radiation emitted from the semiconductor layer sequence in a direction of TCO supporting substrate back into the semiconductor layer sequence. This increases the radiation efficiency of the semiconductor chip.

In this case, the reflective layer can also be constructed from a plurality of layers or for example also be formed only partly over an area or in laterally structured fashion.

Particularly preferably, a distributed Bragg reflector mirror ("DBR mirror" for short) is used as the reflective layer. A DBR mirror comprises a sequence of layers whose refractive indexes are alternately high and low. A DBR mirror reflects in particular radiation that is incident perpendicular to its top side. If the TCO supporting substrate has a lower refractive index than the adjoining semiconductor layer sequence, radiation which is incident obliquely with respect to the semiconductor material/supporting substrate interface, in particular, is reflected at said interface, while radiation which is incident perpendicular to said interface is lost. Therefore, a DBR mirror between the active region of the semiconductor layer sequence and the supporting substrate is particularly suitable for increasing the radiation efficiency of the semiconductor chip.

In addition or as an alternative to the reflective layer between the active region of the semiconductor layer sequence and the TCO supporting substrate, the rear side of the semiconductor chip preferably comprises a metal layer. The latter firstly, like the above-described reflective layer between active region of the semiconductor layer sequence and supporting substrate, directs radiation to the front side of the semiconductor chip and thus increases the radiation efficiency thereof. Secondly, the metal layer generally improves the electrical contact of the rear side of the semiconductor chip to a conductive adhesive or a solder layer, which are often used in order to mount the semiconductor chip later in a housing or on a circuit board.

Furthermore, the front side of the semiconductor chip is preferably roughened. The roughening of the front side of the semiconductor chip reduces the multiple reflections of radiation at the surfaces of the semiconductor chip and therefore contributes to the improved coupling out of radiation. Other structures are also conceivable at the front side of the semiconductor chip for coupling out radiation more efficiently, for example periodic structures whose lateral dimensions are less than or equal to the wavelength of radiation emitted by the semiconductor chip.

Preferably, the semiconductor chip furthermore comprises a current spreading layer, which is applied on that side of the semiconductor layer sequence which faces the front side of the semiconductor chip, and comprises a material from the group of TCOs. The current spreading layer advantageously has the effect that current impressed into the semiconductor chip on the front side is distributed laterally as uniformly as possible into the semiconductor layer sequence, and in particular into the active radiation-generating region thereof. This leads to an increase in the generation of radiation with energization remaining the same, and also to a more homogeneous emission characteristic of the semiconductor chip. Furthermore, a current spreading layer composed of TCO can advantageously be made significantly thinner than a current spreading layer composed of semiconductor material. Moreover, a current spreading layer composed of TCO absorbs significantly less radiation in comparison with a current spreading layer composed of a material having a higher absorption coefficient for the radiation of the semiconductor chip, such as a metal for example.

For making electrical contact with the semiconductor chip on the front side, in one preferred embodiment the front side of said semiconductor chip comprises an electrically conductive bonding pad. Via said electrically conductive bonding pad, the semiconductor chip can be electrically conductively connected, for example by means of a bonding wire, to an electrical connection of a housing or an electrical connection track of a circuit board.

DETAILED DESCRIPTION OF THE DRAWINGS

In the exemplary embodiments and figures, identical or identically acting component parts are in each case provided with the same reference symbols. The elements illustrated should not in principle be regarded as true to scale, rather individual elements, such as e.g. layer thicknesses, may be illustrated with an exaggerated size in order to afford a better understanding.

Figure 1:
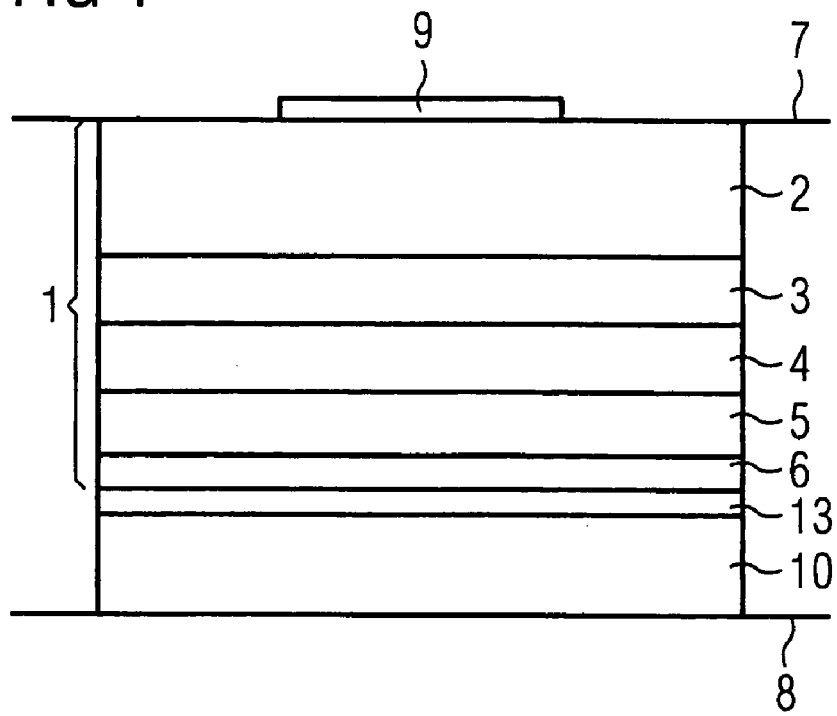
FIG. 1 shows a schematic sectional illustration of a semiconductor body in accordance with a first exemplary embodiment.

In the exemplary embodiment in accordance with FIG. 1, the semiconductor chip comprises a semiconductor layer sequence 1 having a current spreading layer 2 applied on the n side, an n-type cladding layer 3, an active region 4, a p-type cladding layer 5 and a p-type contact layer 6. The active region 4 is arranged between the p-type cladding layer 5 and the n-type cladding layer 3, wherein the n-type cladding layer 3 is arranged between the active region 4 and the radiation-emitting front side 7 of the semiconductor chip and the p-type cladding layer 5 is arranged between the active region 4 and the rear side 8 of the semiconductor chip. The p-type contact layer 6 is applied to that side of the p-type cladding layer 5 which faces the rear side 8 of the semiconductor chip, while the current spreading layer 2 is disposed downstream of the n-type cladding layer 3 in the emission direction of the semiconductor chip. Furthermore, a front-side electrical bonding pad 9 is applied to the current spreading layer 2, from which bonding pad 9 for example contact fingers extend laterally over the front side 7 of the semiconductor chip (not illustrated in the figure) and to which bonding pad 9 it is possible to apply a bonding wire for electrically connecting the semiconductor chip to an electrically conductive region of a housing or a circuit board. As an alternative, the semiconductor chip can also be provided for being electrically connected on the front side while dispensing with a bonding wire, for example by means of an electrically conductive layer that electrically conductively connects the front side 7 of the semiconductor chip to an electrically conductive region of a housing or a circuit board.

Furthermore, a TCO contact layer 13 is applied to that side of the p-type contact layer 6 which faces the rear side 8 of the semiconductor chip, said TCO contact layer being connected to a TCO supporting substrate 10 without a joining layer, for example by means of diffusion bonding or direct bonding.

The TCO supporting substrate 10 has a material from the group of TCOs and is therefore electrically conductive and transmissive to the radiation of the semiconductor chip. Furthermore, the material of the TCO contact layer need not necessarily correspond to the material of the TCO supporting substrate.

In the present case, the semiconductor layer sequence 1 is based on a phosphide compound semiconductor material. In the present case, the active region 4 comprises for example undoped InGaAlP, has a thickness of between 100 nm and 1 µm and generates electromagnetic radiation from the yellow to red spectral range of visible light during operation. The n-type cladding layer 3 comprises n-doped InAlP and the p-type cladding layer 5 comprises p-doped InAlP. The cladding layers 3, 5 each have a thickness of between 200 nm and 1 µm. The p-type contact layer 6 comprises highly p-doped AlGaAs and has a thickness of between 50 nm and 200 nm. The current spreading layer 2 comprises InGaAlP or AlGaAs and preferably has a thickness of between 1 µm and 10 µm. The TCO contact layer 13 comprises a TCO, in the present case for example zinc oxide doped with 2% aluminum, and has a thickness of between 50 nm and 2000 nm.

The active region 4 for generating radiation comprises for example a pn junction, a double heterostructure, a single quantum well or a multiple quantum well structure. The n-type cladding layer 3 and the p-type cladding layer 5 have the task of circumscribing the respective charge carriers to the active region 4. The p-type contact layer 6 furthermore serves for producing an improved electrical contact, preferably with an ohmic characteristic, between TCO contact layer 13 and semiconductor layer sequence 1, while with the aid of the current spreading layer 2 current impressed into the semiconductor chip via the front-side bonding pad 9 is distributed laterally as uniformly as possible into the semiconductor layer sequence 1 and in particular into the active radiation-generating region 4.

In the present case, the semiconductor layer sequence 1 is grown epitaxially for example on a GaAs growth substrate. The TCO contact layer 13 is subsequently applied to that side of the p-type contact layer 6 which faces the rear side 8 of the semiconductor chip. Said TCO contact layer 13 can be applied for example epitaxially, by means of sputtering, vapor deposition, or with the aid of sol-gel process. Sol-gel processes for applying TCO layers are described for example in the documents DE 197 19 162 A1 and L. Spanhel et al., "Semiconductor Clusters in Sol-Gel process: Quantized Aggregation, Gelation and Crystal Growth in Concentrated ZnO Colloids", J. Am. Chem. Soc. (1991), 113, 2826-2833, the disclosure contents of both of which in this regard are incorporated herein by reference.

A TCO supporting substrate 10 composed for example of ZnO or ITO having a thickness of between 50 µm and 200 µm is subsequently applied to the TCO contact layer 13 by means of diffusion bonding. For this purpose, the interfaces of the TCO supporting substrate 10 and the TCO contact layer 13 are brought into contact with one another and exposed to temperatures of between 1075° C. and 1525° C. and pressure in the region of the yield stress of the joining partners to be connected for a few hours, with the result that a cohesive mechanically stable connection arises between the TCO contact layer 13 and the TCO supporting substrate 10. Normally, an electrically conductive connection furthermore advantageously forms between TCO contact layer 13 and the TCO supporting substrate 10.

After the TCO supporting substrate 10 has been applied, the growth substrate is thinned or removed, for example by grinding and/or selective wet-chemical etching.

On account of the difference between the refractive index of the semiconductor layer sequence 1 (n(InGaAlP)~3.5) and the refractive index of the TCO supporting substrate 10 (n(ZnO)~1.85), in the case of the semiconductor chip in FIG. 1, radiation which is generated in the active region 4 of the semiconductor layer sequence 1 and impinges on the semiconductor layer sequence 1/TCO supporting substrate 10 interface is reflected back into the semiconductor layer sequence 1.

Figure 2:
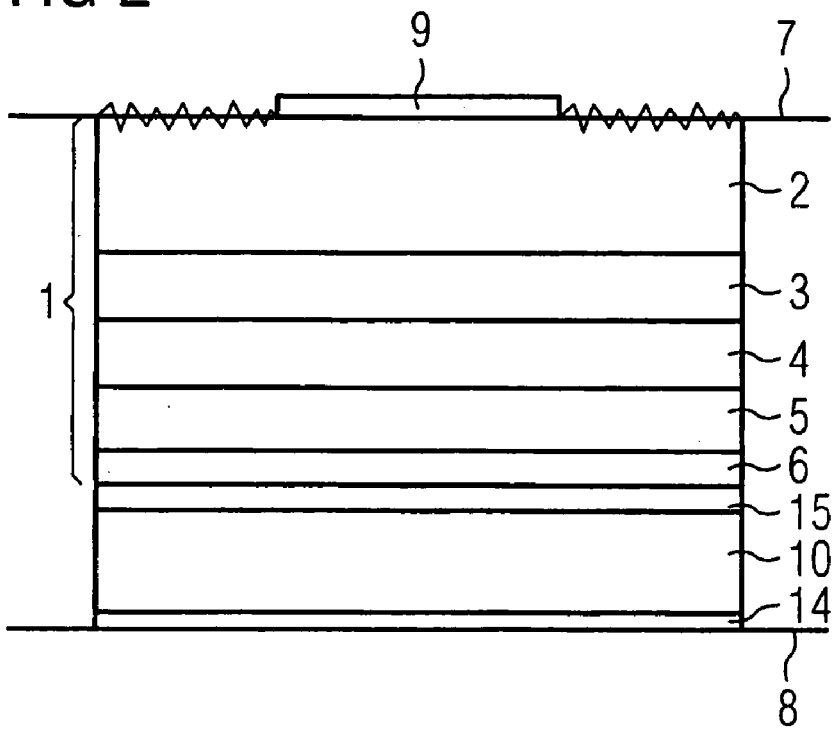
FIG. 2 shows a schematic sectional illustration of a semiconductor body in accordance with a second exemplary embodiment.

In contrast to the semiconductor chip in accordance with the exemplary embodiment of FIG. 1, the semiconductor chip in the exemplary embodiment in accordance with FIG. 2 comprises a roughened front side 7, which can be produced by etching, for example. The roughening of the front side of the semiconductor chip 7 enables the radiation to be coupled out better from the semiconductor chip into the surroundings, since radiation losses on account of multiple reflection at the interfaces of semiconductor body/surroundings are generally reduced.

Furthermore, the rear side 8 of the semiconductor chip in FIG. 2 comprises a metal layer 14, which is provided for improving the electrical contact with a conductive adhesive or solder by means of which the semiconductor chip is mounted in a housing or on a circuit board at a later point in time. Furthermore, the metal layer 14 reflects radiation generated within the semiconductor layer sequence 1 back into the latter. The metal layer 14 has for example gold or aluminum.

In contrast to the semiconductor chip in accordance with FIG. 1, the semiconductor chip in accordance with FIG. 2 does not have a TCO contact layer 13, but rather a TCO layer 15, which in the present case has essentially the same TCO material as the TCO supporting substrate 10, namely ZnO. In the present example, the TCO supporting substrate 10 is connected to the TCO layer 15 by means of direct bonding. For this purpose, the surfaces of the joining partners which are to be connected must generally have roughnesses which are less than or equal to one nanometer. If this is not the case, the surfaces of the joining partners which are to be connected are correspondingly polished. If the TCO layer 15 has to be polished, then this must correspondingly be taken into account when choosing its thickness.

If the roughnesses of the surfaces of the joining partners TCO supporting substrate 10 and TCO layer 15 lie below the value specified above, the latter are brought into direct contact with one another and exposed to temperatures of between 300° and 1000° for a few hours, with the result that a cohesive mechanical stable connection arises between TCO supporting substrate 10 and TCO layer 15. In this case, an electrically conductive connection normally advantageously forms between TCO layer 15 and the TCO supporting substrate 10. Furthermore, in addition to the exposure to temperature, exposure to pressure of up to approximately 20 bar can also be effected. This is normally not absolutely necessary, however.

It should be pointed out at this juncture that the TCO layer 15 can be used not only as an alternative to the TCO contact layer 13, but also in addition. In this case, the TCO contact layer 13 is arranged either between the p-type contact layer 6 and the TCO layer 15 or between the TCO layer 15 and the TCO supporting substrate 10.

Furthermore, the surfaces to be connected can be heavily n-doped, for example with one of the n-type dopants already mentioned in the general part of the description, in order to improve the electrical contact between the TCO supporting substrate 10 and the semiconductor layer sequence 1.

Figure 3:
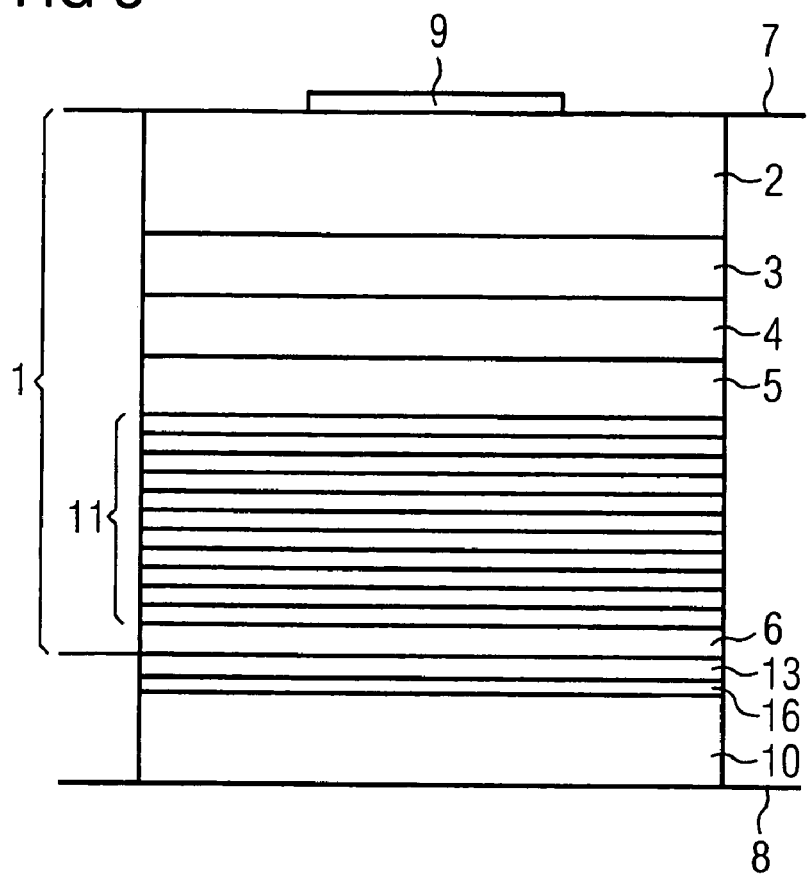
FIG. 3 shows a schematic sectional illustration of a semiconductor body in accordance with a third exemplary embodiment.

In contrast to the exemplary embodiments in accordance with FIG. 1 and FIG. 2, the semiconductor chip of the exemplary embodiment in accordance with FIG. 3 comprises a reflective layer, in the present case a DBR mirror 11 arranged between the p-type cladding layer 5 and the p-type contact layer 6. The DBR mirror 11 has a sequence of layers, in the present case between ten and twenty, which alternately have a high refractive index and a low refractive index. In the present exemplary embodiment, the DBR mirror for reflecting the radiation from the yellow to red spectral range of visible light can be based for example on AlGaAs or AlGaInP, the refractive indexes being varied alternately in each case by variation of the Al and Ga content of the layers.

Furthermore, the semiconductor chip in accordance with FIG. 3, in contrast to the semiconductor chip in accordance with FIG. 1, has an adhesive layer 16 arranged between the TCO contact layer 13 and the TCO supporting substrate 10. The adhesive layer 16 contains for example an electrically conductive adhesive which is preferably transmissive to the radiation of the semiconductor chip.

As an alternative, the semiconductor layer sequence 1 can also be applied to the TCO supporting substrate 10 by means of an electrically insulating adhesive, such as BCB for example. In this case, the roughnesses of the surfaces to be connected are at least in the region of a few nm. In this embodiment, the adhesive layer 16 is made so thin that adhesive is contained only between elevations on account of the roughness of the surfaces to be connected, while the surfaces at the elevations are in direct mechanical contact with one another in such a way that an electrically conductive contact forms between the surfaces.

If an electrically insulating adhesive, for example BCB, is used to apply the semiconductor layer sequence 1 to the TCO supporting substrate 10, then it can be applied by spin-coating in a thin layer for example onto one or both surfaces to be connected. After the adhesive has been applied, the two surfaces to be connected are brought into contact with one another. By exposure to pressure, it is now possible to force out excess adhesive laterally, such that the adhesive layer 16 is made so thin that an electrical contact arises via elevations of the surfaces to be connected, as described above.

Figure 4:
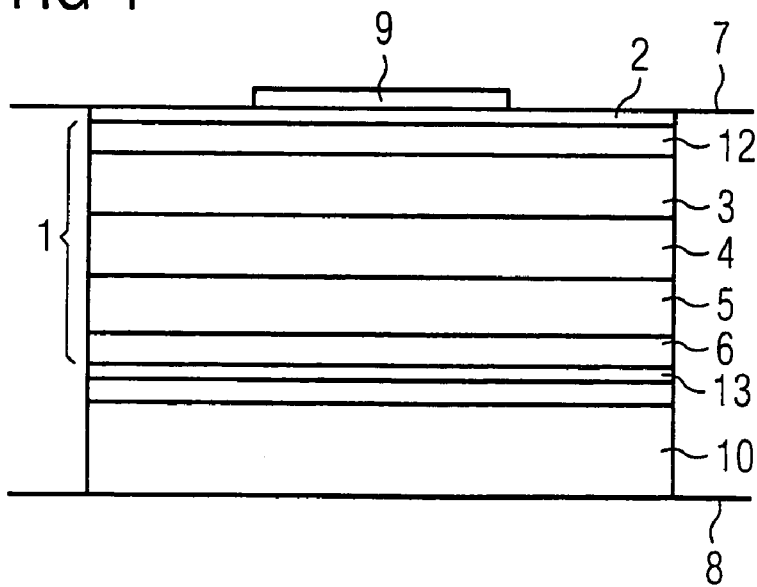
FIG. 4 shows a schematic sectional illustration of a semiconductor body in accordance with a fourth exemplary embodiment.

In the exemplary embodiment in accordance with FIG. 4, in contrast to the exemplary embodiment in accordance with FIG. 1, the semiconductor chip comprises an n-type contact layer 12 composed of highly n-doped AlGaAs having a thickness of between 50 and 200 nm, which is arranged on that side of the n-type cladding layer 3 which faces the front side 7 of the semiconductor chip. An n-side current spreading layer 2 comprising a TCO and having a thickness of between 200 nm and 1 µm is disposed downstream of the n-type contact layer 12 as seen from the semiconductor layer sequence 1. In order to improve the electrical contact between the n-type contact layer 12 and the n-side current spreading layer 2 composed of TCO, preferably in such a way that it has an ohmic characteristic, it is possible to arrange between these two layers contact locations for example composed of Au/Ge (not illustrated in the figure).

As in the exemplary embodiment in accordance with FIG. 1, in the exemplary embodiment in accordance with FIG. 4, a TCO contact layer 13 comprising a TCO is arranged between the p-type contact layer 6 and the TCO supporting substrate 10. In this case, the TCO contact layer 13 does not necessarily have the same material as the TCO supporting substrate 10 and contributes to an improved electrical contact with preferably an ohmic characteristic between the TCO supporting substrate 10 and the semiconductor layer sequence 1. The TCO supporting substrate 10 can be fixed to the semiconductor layer sequence for example by means of direct bonding or diffusion bonding. As an alternative, the TCO supporting substrate 10 can also be fixed to the semiconductor layer sequence by means of adhesive bonding.

The invention is not restricted by the description on the basis of the exemplary embodiments. Rather, the invention encompasses any new feature and also any combination of features, which in particular comprises any combination of features in the patent claims, even if this feature or this combination itself is not explicitly specified in the patent claims or exemplary embodiments.

The invention claimed is:

1. An optoelectronic semiconductor chip which emits electromagnetic radiation from a front side during operation, comprising:
    a semiconductor layer sequence based on a III-V compound semiconductor material and having an active region suitable for generating the electromagnetic radiation;
    a separately produced TCO supporting substrate, which is arranged at the semiconductor layer sequence and has a material comprising a transparent conductive oxide ("TCO") and mechanically supports the semiconductor layer sequence; and
    a TCO contact layer which is arranged between the semiconductor layer sequence and the TCO supporting substrate, said TCO contact layer producing an electrical contact between the semiconductor layer sequence and the TCO supporting substrate and having a material comprising a transparent conductive oxide (TCO),
    wherein the TCO supporting substrate is bonded to the TCO contact layer.

2. The optoelectronic semiconductor chip as claimed in claim 1, wherein a refractive index of the TCO supporting substrate is less than a refractive index of the semiconductor layer sequence.

3. The optoelectronic semiconductor chip as claimed in claim 1, wherein the TCO supporting substrate is fitted to the semiconductor layer sequence by direct bonding, diffusion bonding or adhesive bonding.

4. The optoelectronic semiconductor chip as claimed in claim 1, further comprising a TCO layer having a material comprising a TCO arranged between the semiconductor layer sequence and the TCO supporting substrate.

5. The optoelectronic semiconductor chip as claimed in claim 1, wherein the TCO contact layer has a thickness which is $\geq 1$ μm and $\leq 5$ μm.

6. The optoelectronic semiconductor chip as claimed in claim 1, wherein a layer that reflects the radiation of the semiconductor chip is arranged between the active region of the semiconductor layer sequence and the TCO supporting substrate.

7. The optoelectronic semiconductor chip as claimed in claim 6, wherein the reflective layer is a distributed Bragg reflector (DBR) mirror.

8. The optoelectronic semiconductor chip as claimed in claim 1, wherein a rear side of the semiconductor chip, arranged opposite the front side of said semiconductor chip, comprises a metal layer.

9. The optoelectronic semiconductor chip as claimed in claim 8, wherein the metal layer is formed in reflective fashion for the radiation of the semiconductor chip.

10. The optoelectronic semiconductor chip as claimed in claim 1, wherein the front side is roughened.

11. The optoelectronic semiconductor chip as claimed in claim 1, wherein a current spreading layer having a material comprising a TCO is arranged on a side of the semiconductor layer sequence which faces the front side of said semiconductor chip.

12. The optoelectronic semiconductor chip as claimed in claim 1, wherein the TCO contact layer comprises an n-doped layer which is in direct contact with the TCO supporting substrate and an n-doped transverse conductive layer which is in direct contact with the semiconductor layer sequence.

13. The optoelectronic semiconductor chip as claimed in claim 12, wherein the n-doped layer which is in direct contact with the TCO supporting substrate has a higher doping than the n-doped transverse conductive layer which is in direct contact with the semiconductor layer sequence.

* * * * *